(12) United States Patent
Aspemyr et al.

(10) Patent No.: US 7,679,465 B2
(45) Date of Patent: Mar. 16, 2010

(54) OSCILLATOR CIRCUIT

(75) Inventors: Lars Aspemyr, Kungsbacka (SE); Harald Jacobsson, Frölunda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 12/088,219

(22) PCT Filed: Sep. 27, 2005

(86) PCT No.: PCT/SE2005/001429

§ 371 (c)(1), (2), (4) Date: Mar. 26, 2008

(87) PCT Pub. No.: WO2007/037724

PCT Pub. Date: Apr. 5, 2007

(65) Prior Publication Data

US 2009/0128245 A1    May 21, 2009

(51) Int. Cl.
*H03B 5/12* (2006.01)
(52) U.S. Cl. .................. 331/117 FE; 331/167
(58) Field of Classification Search ........... 331/117 FE, 331/117 R, 167
See application file for complete search history.

(56) References Cited

U.S. PATENT DOCUMENTS

| 3,745,480 | A | * | 7/1973 | Putzer | 331/60 |
| 5,923,221 | A | * | 7/1999 | Dobrovolny | 331/117 D |
| 6,667,666 | B2 | * | 12/2003 | Uzunoglu | 331/173 |
| 2001/0015681 | A1 | * | 8/2001 | Hino | 331/117 R |

* cited by examiner

*Primary Examiner*—Joseph Chang

(57) ABSTRACT

The present invention relates to an oscillator circuit having a resonant element, an active element, a feedback loop, and an additional loop comprising a phase shifting element.

21 Claims, 7 Drawing Sheets

OSCILLATOR CIRCUIT

TECHNICAL FIELD OF THE INVENTION

The present invention relates to an oscillating electrical circuit having multiple loops.

BACKGROUND OF THE INVENTION

The basic concept of a single ended oscillator comprising an active element A and the feedback element β is illustrated in FIG. 5. To start and maintain an oscillation in an electrical oscillator, normally the output of an active element is fed back to the input of the active device by a feedback network, which creates a loop-gain larger than one. The feedback elements have normally narrow-band characteristics. Moreover, the oscillation frequency for the oscillator may be varied by electrically controlling the centre frequency for the feedback element.

This is further illustrated in FIGS. 1a and 1b for a differential realisation. To create an oscillator with low phase noise, fast switching of the active device(s) is/are advantageous. Moreover, the relation in time between the current injected by the active device into the resonant element and the voltage over the resonant element, as in FIG. 1a, is important if low phase noise is required.

To achieve fast switching, the loop-gain may be increased by increasing the gain of the active device either by having a wider device, which is valid in the case of FET (Field Effect Transistor), or by increasing the bias current for the active device. However, increasing the power consumption is not desired and wider transistors will result in more parasitic capacitance, which counteracts fast switching. Moreover, it is not possible to control the phase of the injected current pulse in an optimal way with the common oscillator topologies shown in FIGS. 1a and 1b.

In FIG. 1a, the oscillator circuit 100a comprises two resonant elements 101a and 102a, which at a common terminal are fed from a supply voltage 110a and connected to the drains and gates of transistors T1a and T2a, respectively. Feedback element 103a is connected between the drain of transistor T1a and gate of transistor T2a and feedback element 104a is connected between the drain of T2a and gate of transistor T1a. Optionally, a voltage bias source 120a may be connected to the gates of the transistors T1a and T2a via an impedance element 105a. The sources of the transistors are AC grounded, optionally through a current bias source 130a.

FIG. 1b illustrates another oscillator circuit 100b in which a resonant element 101b is connected to the drains of active elements T1b and T2b. Active elements comprising two transistors T3b and T4b are connected with gate and drain common to T1b and T2b, respectively. The drain of T3b is connected to the common gates of T4b and T2b while the drain of T4b is connected to the common gates of T3b and T1b, constituting the feedback. The circuit is fed with a supply voltage 110b through the sources of T3b and T4b. The sources of transistors T1b and T2b are grounded, optionally through a current bias source 130b.

It is also possible to provide additional feedback elements in the circuit according to FIG. 1b. Moreover, the current source can be provided on top of the circuit.

Prior art according to "Design Issues in CMOS Differential LC Oscillators", by A. Hajimiri et al, IEEE journal of Solid State Circuits, Vol. 34, No. 5, May 1999, discloses a topology for oscillators, in which fast switching and current pulse optimisation is achieved. However, this document is silence about the novel connection according to the present invention.

SUMMARY OF THE INVENTION

The objects of the present invention are to provide an oscillator with fast switching characteristics and current pulse optimisation. The presented invention allows realization in a very compact (and low parasitic) way. The characteristics will further allow very high frequency VCOs based on this topology.

Thus, the invention according to a preferred embodiment will provide a faster or/and more optimised switching resulting in lower oscillator phase noise for a fixed bias current.

In the preferred embodiment, the current between the source node and the ground obtains a lower amplitude for its DC component.

For these reasons an oscillator circuit comprises a resonant element, an active element, a feedback loop, and an additional feedback loop comprising a phase shifting element. The resonant element is connected to a drain of the active element and the feedback loop is connected to gate of the active element and resonant element and the additional feedback loop is connected between drain and gate of the active element.

The additional element may also be provided with supplementary amplification.

According to one embodiment of the invention, the oscillator circuit further comprises: two resonant elements, having a first common terminal fed from a supply voltage and second terminals connected to the drains of first and second transistors, respectively provided as active elements, feedback elements connected between the drain of the first transistor and gate of the second transistor, and a feedback for each transistor comprising the phase shifting element. Preferably, the feedback comprises an amplifier and inverter networks connected between drain and gate of the first and second transistor, respectively. The sources of the transistors may be connected to ground through one of directly, a current bias source, via a resistor, impeditive element or current generator. A voltage bias network may be connected to gates of the first and second transistors.

According to a second embodiment, the oscillator circuit comprises: a first transistor pair, a second transistor pair, a resonant element arranged connected to the drains of a first and a second active element pair, first and second active element pair, each transistor pair has gate and drain connected, wherein a drain of a first transistor in the transistor pair is connected to gate common of a second transistor in the transistor pair, a supply voltage source connected to the sources of the first and second transistors, and additional feedback elements connected between the drains and gates of the active elements.

The resonant elements may comprise one or several of LC circuits and the feedback elements may comprise capacitors or transformers.

The additional feedback loops may comprise transistors having their gates connected to the drains of the same transistors, respectively, and their outputs (drain) connected to the gates of transistors. A bias voltage can be applied to the sources of the feedback transistors.

Preferably, the feedback loop comprises an inverter network and/or an amplifier.

The invention also relates to a method of providing an oscillator with fast switching characteristics and current pulse optimization, the method comprising the steps of: arranging an oscillator circuit with a resonant element, an active element and a feedback loop, and providing the circuit with an additional feedback loop comprising a phase shifting element.

The invention also relates to an electrical circuit comprising an oscillator as mentioned above.

BRIEF DESCRIPTION OF THE DRAWINGS

In the following, the invention will be further described in a non-limiting way with reference to the accompanying drawings, in which.

DETAILED DESCRIPTION OF THE EMBODIMENTS

Figure 1A:
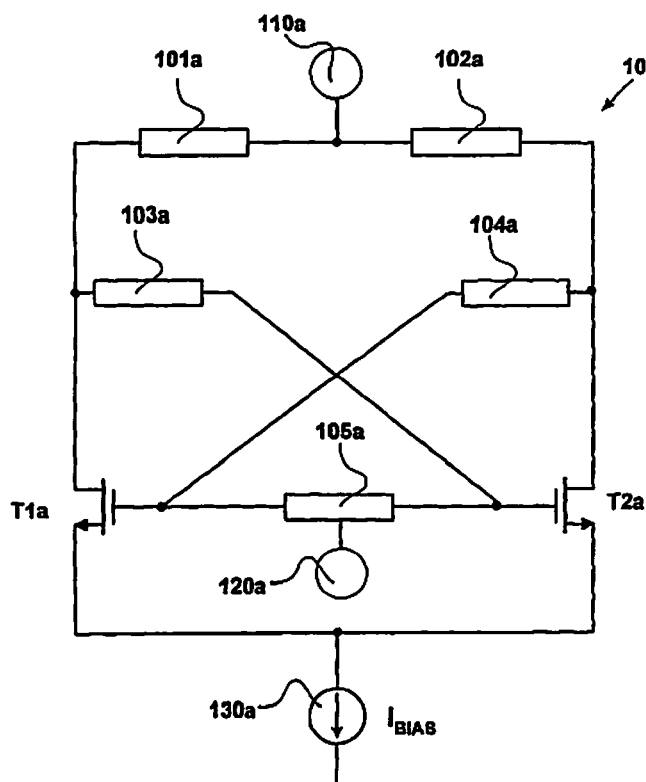
FIGS. 1a and 1b schematically illustrate electrical circuits with oscillator topologies according to prior art, FIGS. 2a and 2b schematically illustrate electrical circuits with oscillator topologies according to the basic concept of the present invention corresponding to the circuits illustrated in FIGS. 1a and 1b, respectively.
Figure 1B:
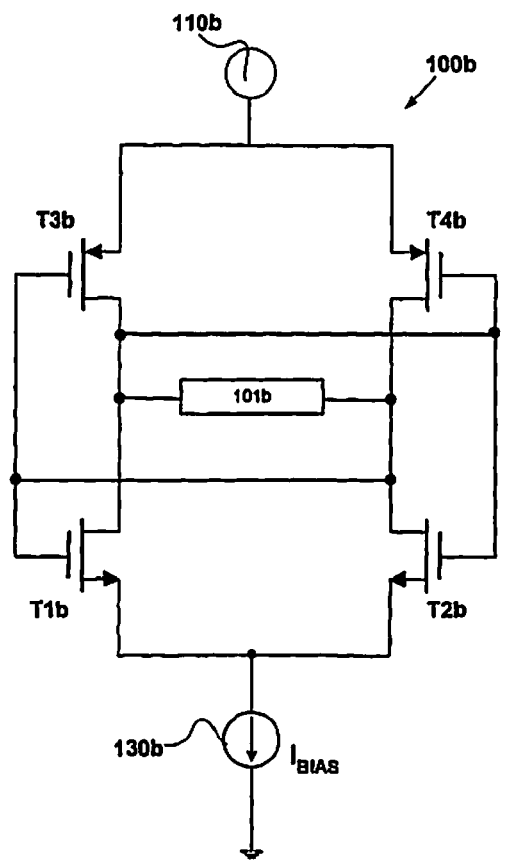

According to the invention, the circuits according to FIGS. 1a and 1b are modified and comprise additional positive feed-back loops with a device having variable gain and variable phase characteristics. By this optimisation a lowered phase noise for the oscillator can be achieved. The active device in the added loop will have a high impedance load, which provides extra voltage gain despite a low current consumption. This is illustrated in FIGS. 2a and 2b.

Figure 2A:
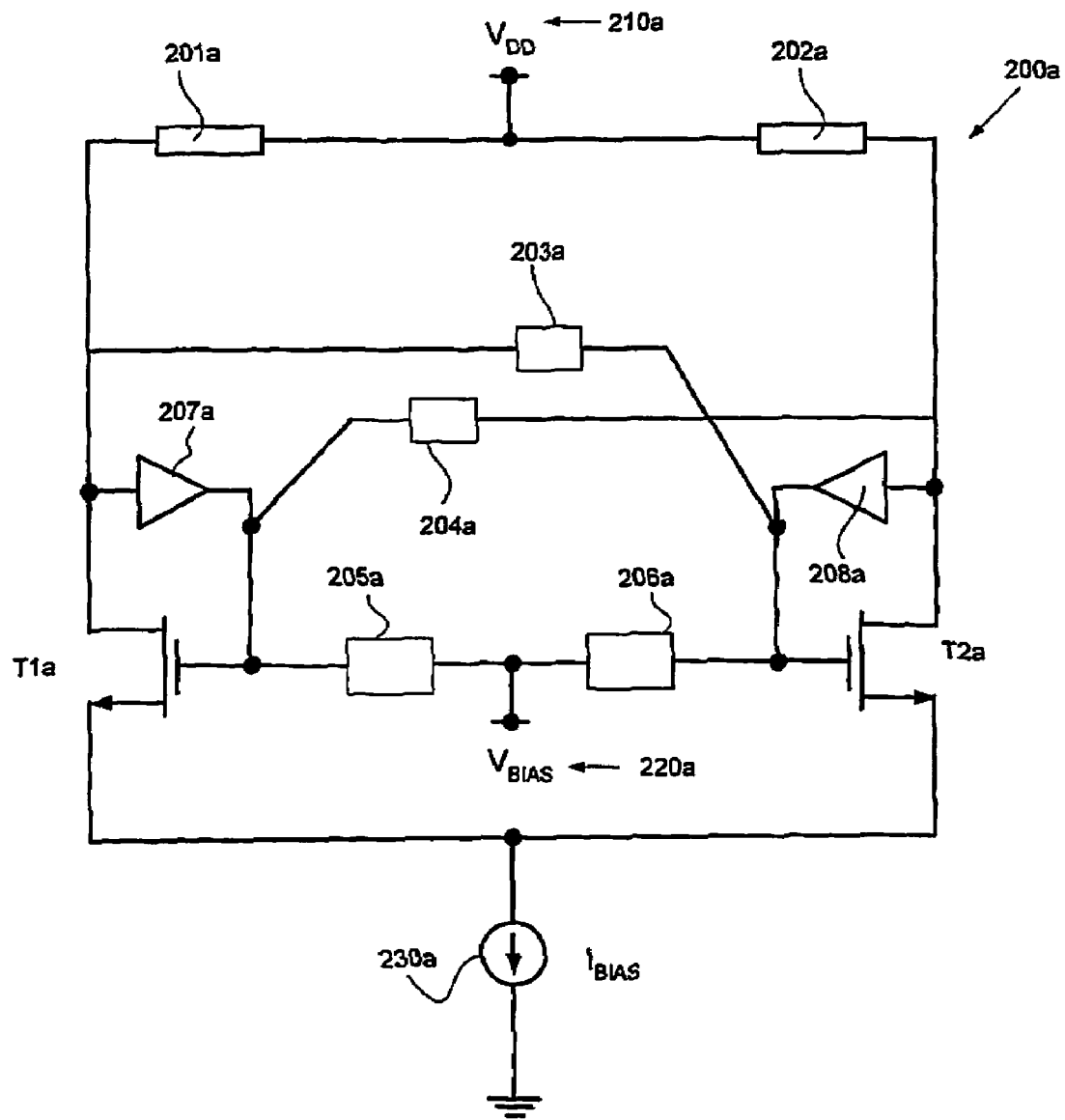

Thus, FIG. 2a illustrates an oscillator circuit 200a, according to one exemplary embodiment of the present invention, comprising two resonant elements 201a and 202a, which at a common terminal are fed from a supply voltage 210a ($V_{DD}$) and connected to the drains of transistors T1a and T2a, respectively. Feedback elements 203a and 204a are connected in series between the drain of one of the transistors to the gate of each other transistor and vice versa. A voltage bias network comprising a source 220a feeding common terminals of, e.g. impedance elements 205a and 206a is connected to the gates of the transistors T1a and T2a. The sources of the transistors are optionally grounded through a current bias source 230a. However, it may also be grounded directly, via a resistor, impeditive element or current generator. The feedback according to the invention comprises amplifier and inverter networks (circuits or elements) 207a and 208a connected between the drain and gate of each transistor T1a and T2a, respectively. The essential characteristic of the feedback elements are phase shifting and amplification.

Even though active elements T1a and T2a are illustrated as MOS transistors, it is obvious that they may be substituted by any type of active elements. This is valid for all embodiments illustrated and described herein.

Figure 2B:
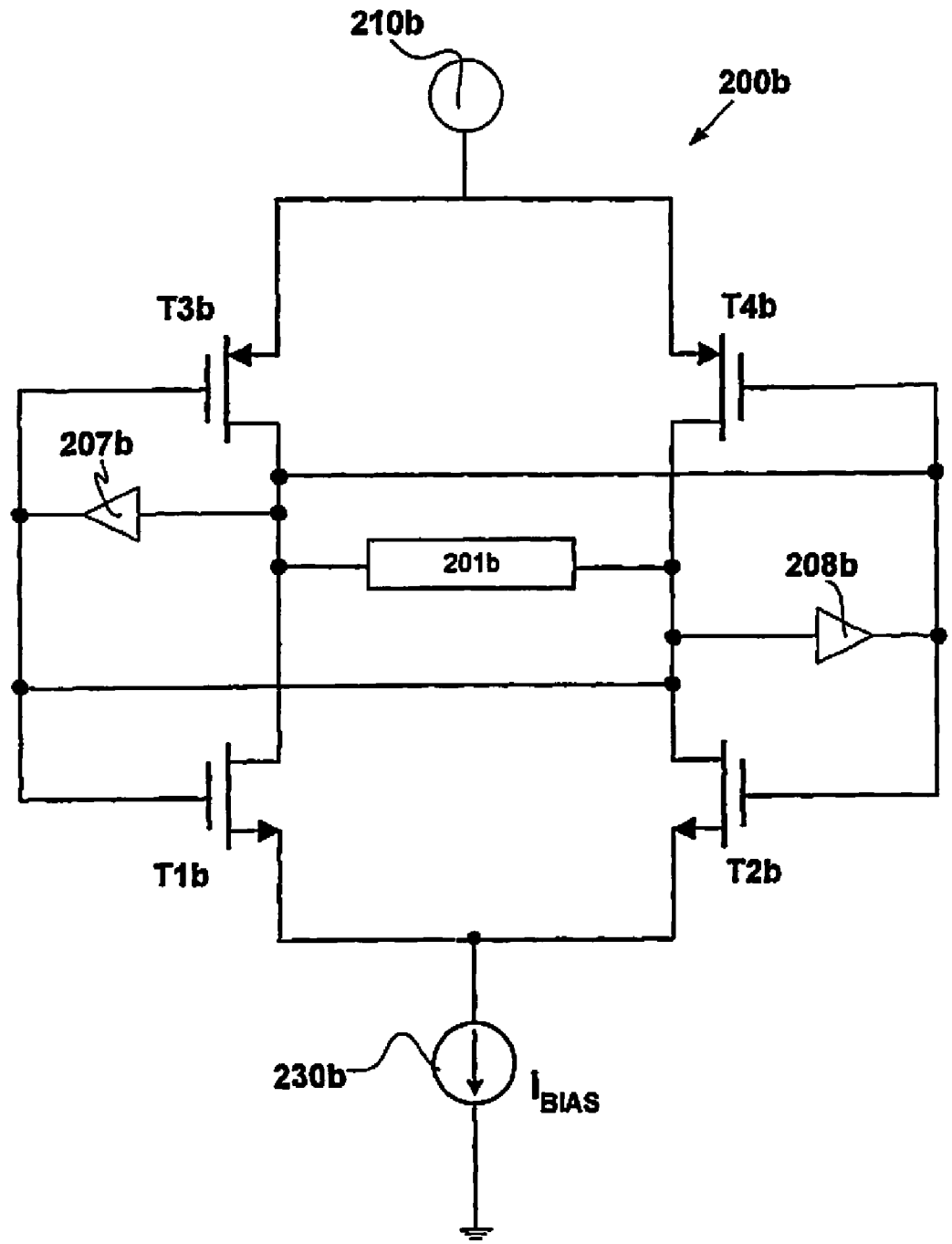

FIG. 2b illustrates another oscillator circuit 200b, in accordance with a second exemplary embodiment of the invention and corresponding to the circuit of FIG. 1b, in which a resonant element 201b is arranged connected to the drains of active elements T1b and T2b, T3b and T4b. Two transistors T3b and T4b are connected with gate and drain common to T1b and T2b, respectively. The drain of T3b is connected to the gates of T4b and T2b while the drain of T4b is connected to the gates of T3b and T1b. The gate-drain connection between T1b, T2b and T3b, T4b constitutes two feedback loops which allow the oscillator to oscillate. Again, there may be provided feedback elements in the feedback path. The circuit is fed with a supply voltage 210b through the sources of T3b and T4b. The sources of transistors T1b and T2b are grounded. The feedback elements 207b and 208b are connected between the output (drain) and gates of the active elements T1b, T2b, T3b and T4b, 207b and 208b provide the additional feedback loops. Thus, the active elements are connected in pairs and the two pairs are complementary. The circuit may also comprise grounded source.

Figure 3:
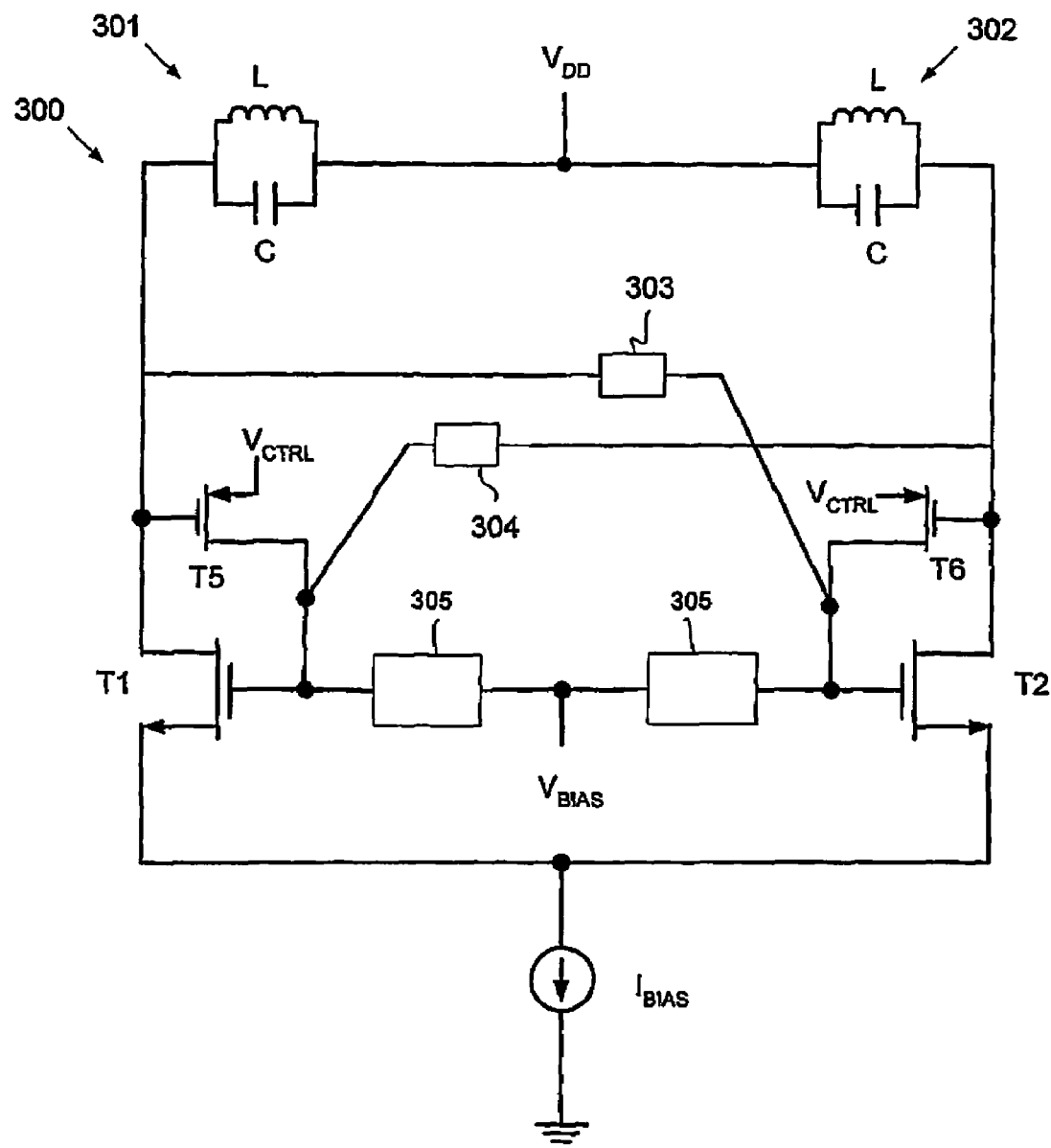
FIG. 3 is a schematic diagram illustrating a third embodiment of the invention.

A more detailed exemplary implementation embodiment of the present invention is illustrated in FIG. 3. The resonant elements 301 and 302 comprise LC circuits. The feedback elements 303 and 304 may comprise transformers or other AC coupling elements. The additional positive feedbacks, according to the invention, comprise transistors T5 and T6 having their gates connected to the drains of the transistors T1 and T2, respectively, and their outputs (drain) connected to the gates of the transistors T1 and T2. A control voltage ($V_{CTRL}$) is applied to the sources of the feedback (PMOS) transistors T5 and T6. Element 305, which may be an inductor or other AC high impedance element, functions as a current generator with or without additional feedback loop.

Figure 4:
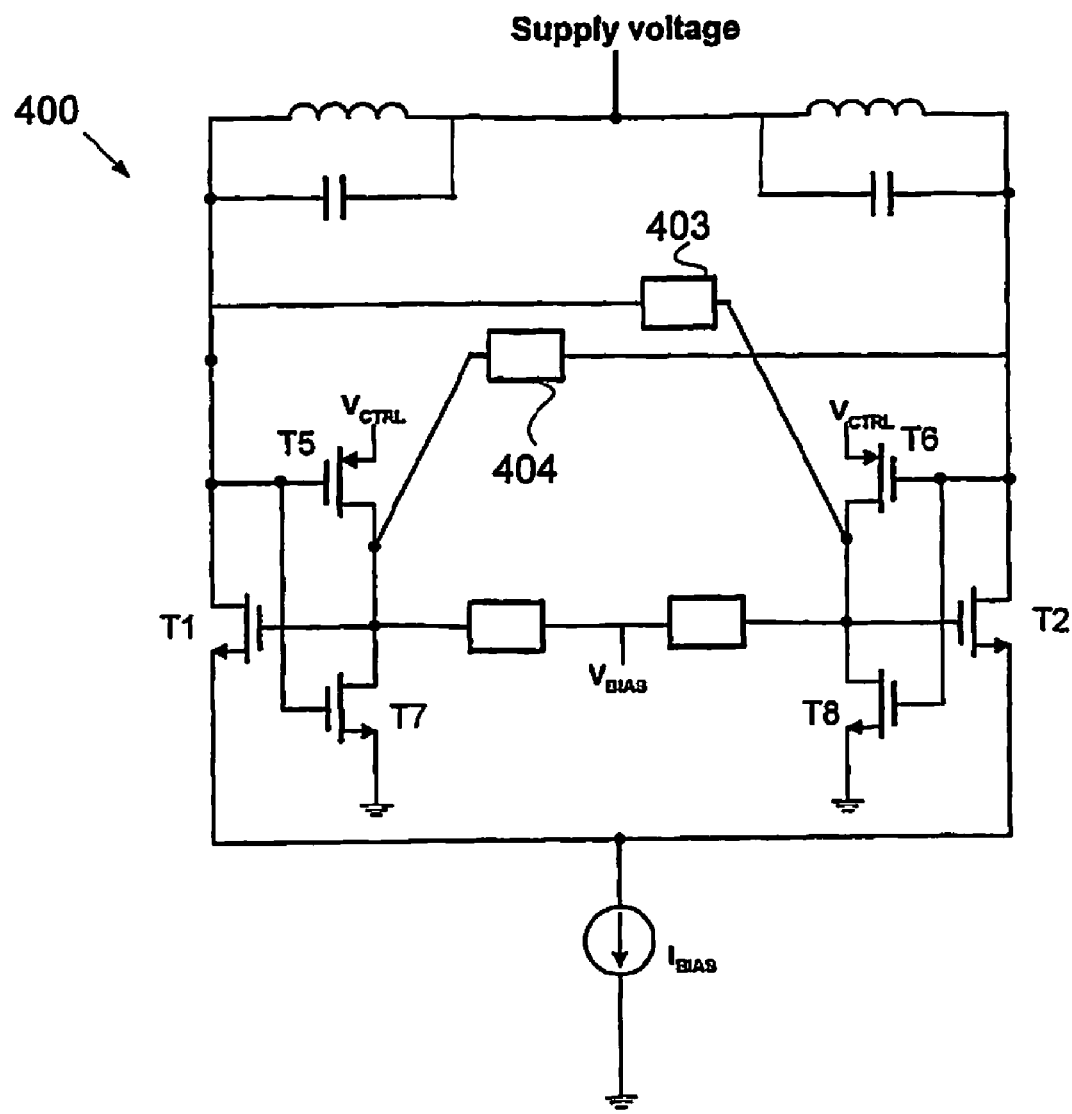
FIG. 4 is a schematic diagram illustrating a fourth embodiment of the invention.
Figure 5:
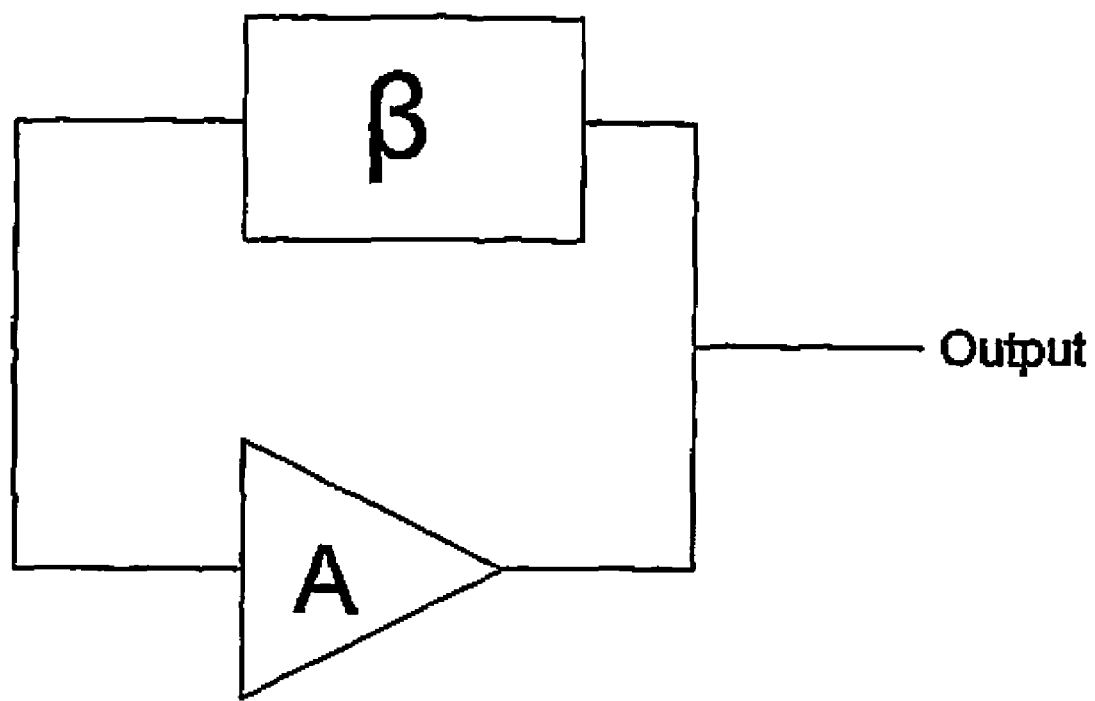
FIG. 5 is a basic oscillator concept.

In a fourth exemplary embodiment as illustrated in FIG. 4, similar to the embodiment of FIG. 3, the feedback network comprises an inverter network comprising transistors T5, T6, T7 and T8, and feedback elements 403 and 404. The inverter network in this case comprises N-channel transistors T7 and T8 grounded at source and connected via drain to gates of T1 and T2 and drains of T5 and T6, respectively.

Figure 6:
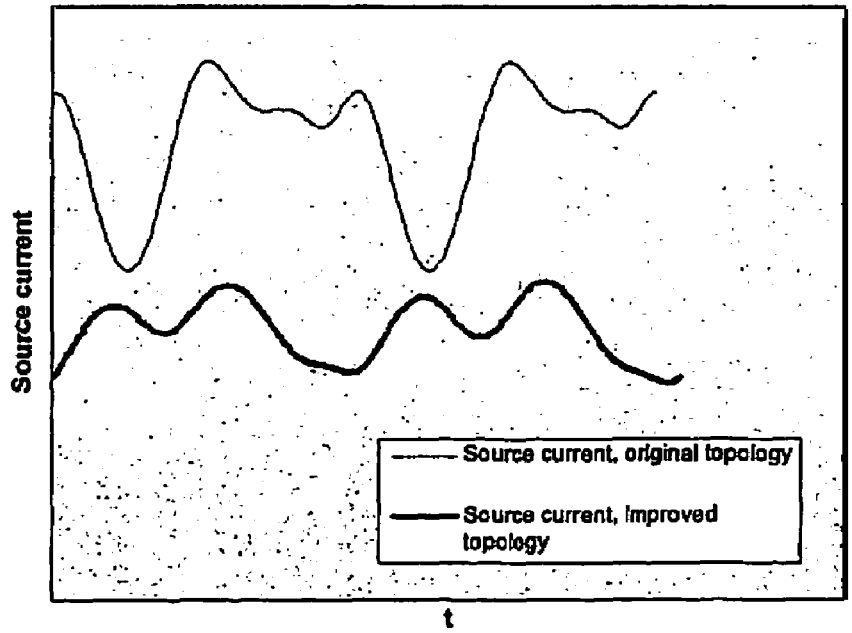
FIG. 6 illustrates the source to ground current graph based on one embodiment of the invention.

To verify the functionality of a circuit according to the present invention some simulations have been carried out. The graph of FIG. 6 illustrates the source to ground current in an oscillator according to FIG. 3, a major difference in current amplitude and the improved current waveform can be observed. A lower current consumption is apparent. Both AC- and DC-components of the current has been reduced. This is due to the enhanced switching and current waveform. In the graph, the dashed line shows the source current time dependency of an ordinary oscillator and the continuous line the source current time dependency of a circuit according to the present invention. It should be noted that both the prior art topology and the embodiment according to the invention provide substantially the same phase noise performance but the power consumption, which is proportional to the mean value of the source to ground current is much lower for the embodiment according to the invention.

In the simulated topology, the transistors are assumed as: NMOS 100 μm/0.1 μm (W/L=1000) and PMOS 50 μm/0.1 μm (W/L 500).

Figure 7:
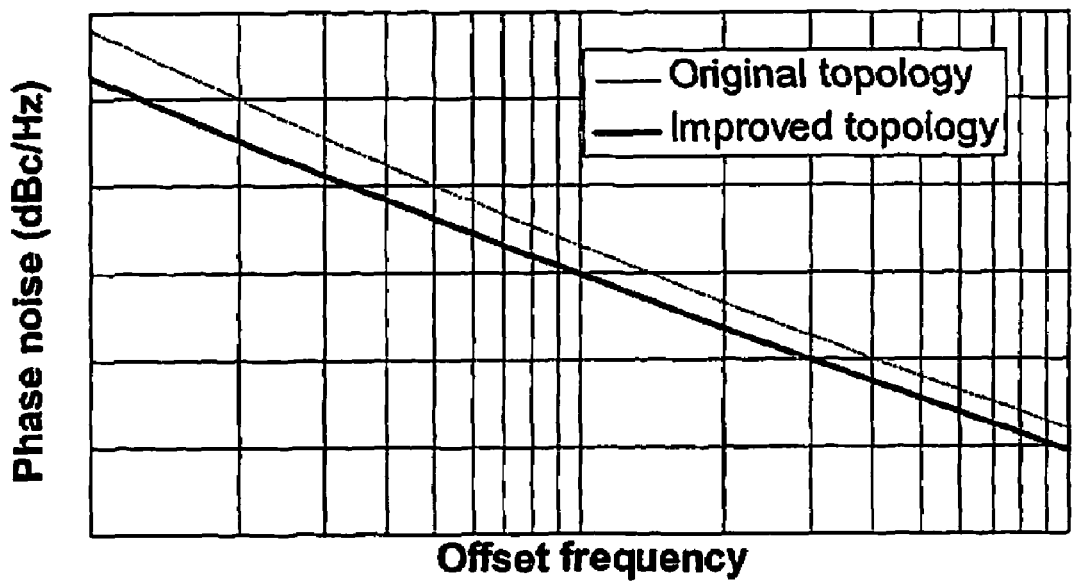
FIG. 7 illustrates a graph of phase noise characteristics, based on one embodiment of the invention.

FIG. 7 illustrates a graph of optimum phase noise performance for the given topology, both with and without the extra feedback loop. In the graph, the dashed line shows the phase noise versus offset frequency of an ordinary oscillator and the continuous line the phase noise versus offset frequency of a circuit according to the present invention. The improved performance does not come with increased power consumption.

The oscillator of the invention may be used for any frequencies and within for example radio and communication applications.

The invention is not limited to the shown embodiments but can be varied in a number of ways without departing from the scope of the appended claims; the arrangement and the method can be implemented in various ways using different technologies depending on application, functional units, needs and requirements etc.

The invention claimed is:

1. An oscillator circuit comprising a resonant element, an active element, a feedback loop, and an additional feedback loop comprising a phase shifting element, wherein said resonant element is connected to a drain of said active element, and said feedback loop is connected to a gate of said active element and the resonant element, and said additional feedback loop is connected between the drain and the gate of said active element.

2. The oscillator circuit of claim 1, wherein said oscillator circuit further comprises:
two resonant elements, having a first common terminal fed from a supply voltage and second terminals connected to drains of first and second transistors, respectively provided as active elements;
a first feedback element connected between said drain of said first transistor and a gate of said second transistor;
a second feedback element connected between the drain of the second transistor and a gate of the first transistor, where the first feedback element and the second feedback element are provided as feedback loops; and
a feedback for each transistor comprising said phase shifting element, where the first feedback is connected between the drain and the gate of the first transistor, and the second feedback is connected between the drain and the gate of the second transistor, where the first feedback and the second feedback are provided as additional feedback loops.

3. The oscillator circuit of claim 2, wherein said feedback comprises an amplifier and inverter networks.

4. The oscillator circuit of claim 2, wherein sources of the first and second transistors are connected to ground through one of directly, a current bias source, a resistor, an impeditive element or a current generator.

5. The oscillator circuit according to claim 2, further comprising a voltage bias network connected to the gates of said first and second transistors via first and second impedance elements, respectively.

6. The oscillator circuit of claim 1, wherein said oscillator circuit comprises:
a first transistor, a second transistor, a third transistor and a fourth transistor, respectively provided as active elements;
the first and third transistors having drains connected to gates of the second and fourth transistors;
the second and fourth transistors having drains connected to gates of the first and third transistors;
the resonant element having a first end connected to the drains of first and third transistors and a second end connected to the drains of the second and fourth transistors;
a supply voltage source connected to sources of the third and fourth transistors, and
a first feedback element connected between the drains and the gates of the first and third transistors; and
a second feedback element connected between the drains and the gates of the second and fourth transistors, where the first feedback element and the second feedback element are provided as additional feedback loops.

7. The oscillator circuit of claim 1, wherein the resonant element comprise one or several of LC circuits.

8. The oscillator circuit of claim 1, wherein the feedback loop comprise capacitors or transformers.

9. The oscillator circuit of claim 2, wherein the additional feedback loops comprise two feedback transistors having their gates connected to the drains of the first and second transistors, respectively, and their drains connected to the gates of first and second transistors, respectively.

10. The oscillator circuit of claim 9, wherein a bias voltage is applied to the sources of the two feedback transistors.

11. The oscillator circuit of claim 1, wherein the additional feedback loop comprises an inverter network.

12. The oscillator circuit of claim 1, wherein the additional feedback loop comprises an amplifier.

13. A method of providing an oscillator with fast switching characteristics and current pulse optimization, the method comprising the steps of:
arranging an oscillator circuit with a resonant element, an active element and a feedback loop, and
providing said oscillator circuit with an additional feedback loop comprising a phase shifting element, wherein said resonant element is connected to a drain of said active element, and said feedback loop is connected to a gate of said active element and the resonant element, and said additional feedback loop is connected between the drain and the gate of said active element.

14. An electrical circuit comprising an oscillator circuit comprising a resonant element, an active element, a feedback loop, and an additional feedback loop comprising a phase shifting element, wherein said resonant element is connected to a drain of said active element, and said feedback loop is connected to a gate of said active element and the resonant element, and said additional feedback loop is connected between the drain and the gate of said active element.

15. An oscillator circuit comprising:
a supply voltage;
a first transistor and a second transistor;
a first resonant element and a second resonant element, where the first resonant element and the second resonant element each have a first common terminal fed from the supply voltage and second terminals connected to drains of the first and second transistors, respectively;
a first feedback element connected between the drain of the first transistor and a gate of the second transistor;
a second feedback element connected between the drain of the second transistor and a gate of the first transistor;
a first feedback connected between the drain and the gate of the first transistor;
a second feedback connected between the drain and the gate of the second transistor.

16. The oscillator circuit of claim 15, wherein:
said first feedback comprises a transistor; and
said second feedback comprises a transistor.

17. The oscillator circuit of claim 15, wherein:
said first feedback comprises an inverter network; and
said second feedback comprises an inventor network.

18. The oscillator circuit of claim 15, wherein sources of the first transistor and the second transistor are connected to ground through one of directly, a current bias source, a resistor, an impeditive element, or a current generator.

19. The oscillator circuit according to claim 15, further comprising a voltage bias network connected to the gates of the first and second transistors via first and second impedance elements, respectively.

20. The oscillator circuit of claim 15, wherein:
said first resonant element comprises an LC circuit; and
said second resonant element comprises an LC circuit.

21. An oscillator circuit comprising:
a first transistor, a second transistor, a third transistor and a fourth transistor;

the first and third transistors having drains connected to gates of the second and fourth transistors;

the second and fourth transistors having drains connected to gates of the first and third transistors;

a resonant element having a first end connected to the drains of the first and third transistors and a second end connected to the drains of the second and fourth transistors;

a supply voltage source connected to sources of the third and fourth transistors;

a first feedback element connected between the drains and the gates of the first and third transistors; and a second feedback element connected between the drains and the gates of the second and fourth transistors.

* * * * *

UNITED STATES PATENT AND TRADEMARK OFFICE
CERTIFICATE OF CORRECTION

PATENT NO. : 7,679,465 B2  Page 1 of 1
APPLICATION NO. : 12/088219
DATED : March 16, 2010
INVENTOR(S) : Aspemyr et al.

It is certified that error appears in the above-identified patent and that said Letters Patent is hereby corrected as shown below:

In Column 4, Line 11, delete "T4b," and insert -- T4b. --, therefor.

Signed and Sealed this

Ninth Day of November, 2010

David J. Kappos
*Director of the United States Patent and Trademark Office*